(12) United States Patent
McColloch et al.

(10) Patent No.: US 8,382,385 B2
(45) Date of Patent: Feb. 26, 2013

(54) OPTICAL TRANSCEIVER MODULE HAVING AN ELECTROMAGNETIC INTERFERENCE (EMI) CANCELLATION DEVICE DISPOSED THEREIN, AND AN EMI CANCELATION METHOD FOR USE IN AN OPTICAL TRANSCEIVER MODULE

(75) Inventors: Laurence R. McColloch, Santa Clara, CA (US); Zuowei Shen, Fremont, CA (US)

(73) Assignee: Avago Technologies Fiber IP (Singapore) Pte. Ltd, Singapore (SG)

( * ) Notice: Subject to any disclaimer, the term of this patent is extended or adjusted under 35 U.S.C. 154(b) by 238 days.

(21) Appl. No.: 13/007,136

(22) Filed: Jan. 14, 2011

(65) Prior Publication Data

US 2012/0183302 A1    Jul. 19, 2012

(51) Int. Cl.
*G02B 6/36* (2006.01)
*H04B 10/02* (2006.01)

(52) U.S. Cl. .............. 385/92; 385/88; 385/94; 398/136; 398/139

(58) Field of Classification Search .................... 385/88, 385/89, 92, 93, 94, 14; 437/577; 398/135, 398/136, 137, 138, 139
See application file for complete search history.

(56) References Cited

U.S. PATENT DOCUMENTS

| | | | |
|---|---|---|---|
| 5,898,127 A | 4/1999 | Schuhmacher et al. | |
| 6,755,578 B1 * | 6/2004 | Mynatt et al. | 385/92 |
| 6,825,411 B2 | 11/2004 | Pommerenke et al. | |
| 6,880,986 B2 * | 4/2005 | Mynatt et al. | 385/94 |
| 7,195,404 B1 | 3/2007 | Dudley | |
| 7,473,131 B2 * | 1/2009 | Dunwoody et al. | 439/607.01 |
| 7,597,590 B2 * | 10/2009 | McColloch | 439/607.18 |
| 2001/0002117 A1 | 5/2001 | Schulze-Buxloh | |
| 2004/0184745 A1 * | 9/2004 | Mynatt et al. | 385/94 |
| 2009/0175582 A1 | 7/2009 | Togami et al. | |
| 2009/0196008 A1 * | 8/2009 | McColloch | 361/818 |
| 2012/0183302 A1 * | 7/2012 | McColloch et al. | 398/136 |

* cited by examiner

*Primary Examiner* — Brian Healy

(57) ABSTRACT

A floating heat sink device is provided that attaches to a cage in a floating configuration that enables the heat sink device to move, or "float", as the parallel optical communications device secured to the cage moves relative to the cage. Because the heat sink device floats with movement of the parallel optical communications device, at least one surface of the parallel optical communications device maintains continuous contact with at least one surface of the heat sink device at all times. Ensuring that these surfaces are maintained in continuous contact at all times ensures that heat produced by the parallel optical communications device will be transferred into and absorbed by the floating heat sink device.

10 Claims, 3 Drawing Sheets

OPTICAL TRANSCEIVER MODULE HAVING AN ELECTROMAGNETIC INTERFERENCE (EMI) CANCELLATION DEVICE DISPOSED THEREIN, AND AN EMI CANCELATION METHOD FOR USE IN AN OPTICAL TRANSCEIVER MODULE

TECHNICAL FIELD OF THE INVENTION

The invention relates to optical transceiver modules. More particularly, the invention relates to a device and method for use in an optical transceiver module for canceling electromagnetic interference (EMI).

BACKGROUND OF THE INVENTION

An optical transceiver module is an optical communications device that has a transmit (TX) portion and a receive (RX) portion. The TX portion includes a laser driver circuit and at least one laser diode. The laser driver circuit outputs an electrical drive signal to each respective laser diode to cause the respective laser diode to be modulated. When the laser diode is modulated, it outputs optical signals that have power levels corresponding to logic 1s and logic 0s. An optics system of the optical transceiver module focuses the optical signals produced by each respective laser diode into the end of a respective transmit optical fiber held within an optical connector module that connects to the optical transceiver module.

The RX portion of the optical transceiver module includes at least one receive photodiode that receives an incoming optical signal output from the end of a respective receive optical fiber held in the optical connector module. The optics system of the transceiver module focuses the light that is output from the end of each receive optical fiber onto the respective receive photodiode. The respective receive photodiode converts the incoming optical signal into an electrical analog signal. An electrical detection circuit, such as a transimpedance amplifier (TIA), receives the electrical signal produced by the receive photodiode and outputs a corresponding amplified electrical signal, which is processed by other circuitry of the RX portion to recover the data.

Some optical transceiver modules have a single laser diode in the TX portion and a single photodiode in the RX portion for simultaneously transmitting and receiving optical signals over transmit and receive fibers, respectively, of transmit and receive optical cables, respectively. The ends of the transmit and receive cables have optical connector modules on them that are adapted to plug into transmit and receive receptacles, respectively, formed in the optical transceiver module. These types of optical transceiver modules are often referred to as pluggable transceiver modules. Small form-factor pluggable (SFP) and SFP+ transceiver modules are examples of pluggable optical transceiver modules. Parallel optical transceiver modules of the type described above may also be configured as pluggable optical transceiver modules, but may also be configured as mid-plane mounted optical transceiver modules that mount to a surface of a circuit board.

Some optical transceiver modules have multiple laser diodes in the TX portion and multiple photodiodes in the RX portion for simultaneously transmitting and receiving multiple optical signals. In these types of optical transceiver modules, which are commonly referred to as parallel optical transceiver modules, the transmit fiber cables and the receive fiber cables have multiple transmit optical fibers and multiple receive optical fibers, respectively. The cables are typically ribbon cables having ends that are terminated in an optical connector module that is configured to be plugged into a receptacle of the optical transceiver module.

Typically, pluggable optical transceiver modules, such as the SFP and SFP+ optical transceiver modules, for example, are designed to be inserted into cages. The pluggable transceiver modules and the cages have locking features disposed on them that allow the transceiver modules to mate with and interlock with the cages. The pluggable transceiver modules typically include latch lock pins that are designed to be received in latch openings formed in the cages. In most pluggable optical transceiver module designs, the area around the latch lock pin constitutes an EMI open aperture that allows EMI to escape from the transceiver module housing. The Federal Communications Commission (FCC) has set standards that limit the amount of electromagnetic radiation that may emanate from unintended sources. For this reason, a variety of techniques and designs are used to shield EMI open apertures in transceiver module housings in order to limit the amount of EMI that passes through the apertures. Various metal shielding designs and resins that contain metallic material have been used to cover areas from which EMI may escape from the housings. So far, such techniques and designs have had only limited success, especially with respect to optical transceiver modules that transmit and receive data at very high data rates (e.g., 10 gigabits per second (Gbps)).

For example, EMI collars are often used with pluggable optical transceiver modules to provide EMI shielding. The EMI collars in use today vary in construction, but generally include a band portion that is secured about the exterior of the transceiver module housing and spring fingers having proximal ends that attach to the band portion and distal ends that extend away from the proximal ends. The spring fingers are periodically spaced about the collar. The spring fingers have folds in them near their distal ends that cause the distal ends to be directed inwards toward the transceiver module housing and come into contact with the housing at periodically-spaced points on the housing. At the locations where the folds occur near the distal ends of the spring fingers, the outer surfaces of the spring fingers are in contact with the inner surface of the cage at periodically spaced contact points along the inner surface of the cage.

The amount of EMI that passes through an EMI shielding device is proportional to the largest dimension of the largest EMI open aperture of the EMI shielding device. Therefore, EMI shielding devices such as EMI collars and other devices are designed to ensure that there is no open aperture that has a dimension that exceeds the maximum allowable EMI open aperture dimension associated with the frequency of interest. For example, in the known EMI collars of the type described above, the spacing between the locations at which the distal ends of the spring fingers come into contact with the inner surface of the cage should not exceed one quarter wavelength of the frequency of interest that is being attenuated. Even greater attenuation of the frequency of interest can be achieved by making the maximum EMI open aperture dimension significantly less than one quarter of a wavelength, such as, for example, one eighth or one tenth of a wavelength. However, the ability to decrease this spacing using currently available manufacturing techniques is limited. In addition, as the frequency of optical transceiver modules increases, this spacing needs to be made smaller in order to effectively shield EMI, which becomes increasingly difficult or impossible to achieve at very high frequencies.

In parallel optical transceiver modules, the optical cables that carry the fibers are typically ribbon cables in which the fibers are arranged side-by-side in a 1×N array, where N is the number of fibers of the ribbon cable. Thus, the transmit fibers are arranged in one 1×N fiber array in one ribbon cable and the receive fibers are arranged in another 1×N array in another ribbon cable. Typically, the ribbon cables are placed one on top of the other such that a 2×N array of fibers enter the optical connector module through a gap formed in the nose of the optical connector module. This gap constitutes an EMI open aperture that is much larger than the maximum allowable EMI open aperture dimension of the optical transceiver module, particularly at high bit rates. Consequently, unacceptable amounts of EMI may escape from the optical transceiver module through the gap.

One technique that is sometimes used to provide EMI shielding at the gap in the optical connector module involves placing a metal EMI shielding device in the nose of the optical connector module surrounding the gap such that the fibers pass through the EMI shielding device. While such shielding devices are relatively effective at preventing EMI from passing through regions in the housing immediately adjacent the gap, they are totally ineffective at preventing EMI from passing through the gap itself, which is filled only with the fibers and air. Of course, the fibers and the air are transparent to EMI.

In general, all of the current techniques of providing EMI shielding in optical transceiver modules attempt to ensure that there are no EMI open apertures that have dimensions that exceed the maximum allowable EMI open aperture dimension. As indicated above, as the frequencies or bit rates of optical transceiver modules continue to increase (i.e., wavelengths continue to decrease), it becomes extremely difficult or impossible to effectively implement these types of solutions. Accordingly, a need exists for an EMI shielding device and a method that do not rely solely on such techniques to provide effective EMI shielding in optical transceiver modules.

SUMMARY OF THE INVENTION

The invention is directed to an optical transceiver module having an EMI cancelation device and an EMI cancelation method. The optical transceiver module comprises an optical transceiver module housing having the EMI cancelation device disposed therein. The EMI cancelation device includes a metal chamber having at least first and second walls that are generally parallel to each other. The first and second chamber walls have first and second openings formed therein, respectively, through which at least one optical fiber passes. The first and second chamber walls are separated from each other by a preselected distance selected to ensure that EMI that passes through the second opening and is incident on the first wall at a first instant in time is reflected by the first wall back toward the second wall and destructively interferes with EMI passing through the second opening at a second instant in time that is later than the first instant in time.

The method comprises providing an optical transceiver module having a housing in which a metal chamber is disposed, and, at a first instant in time, reflecting EMI off of a first wall of the metal chamber toward an opening formed in a second wall of the chamber such that EMI propagating through the second opening at a second instant in time that is later than the first instant in time destructively interferes with the EMI reflected off of the first wall.

These and other features and advantages of the invention will become apparent from the following description, drawings and claims.

DETAILED DESCRIPTION OF AN ILLUSTRATIVE EMBODIMENT

In accordance with the invention, an optical transceiver module is equipped with an EMI cancelation device having a propagation chamber that has dimensions selected based on the primary frequency of the optical transceiver module such that at least some of the EMI propagating in the chamber experiences destructive interference and is canceled. In addition, the EMI cancelation device may include an EMI absorbing material that absorbs at least some EMI that is not canceled. Consequently, the EMI cancelation device is very effective at attenuating EMI to prevent it from escaping from the optical transceiver module. Illustrative, or exemplary, embodiments of the invention will now be described with reference to the figures.

Figure 1:
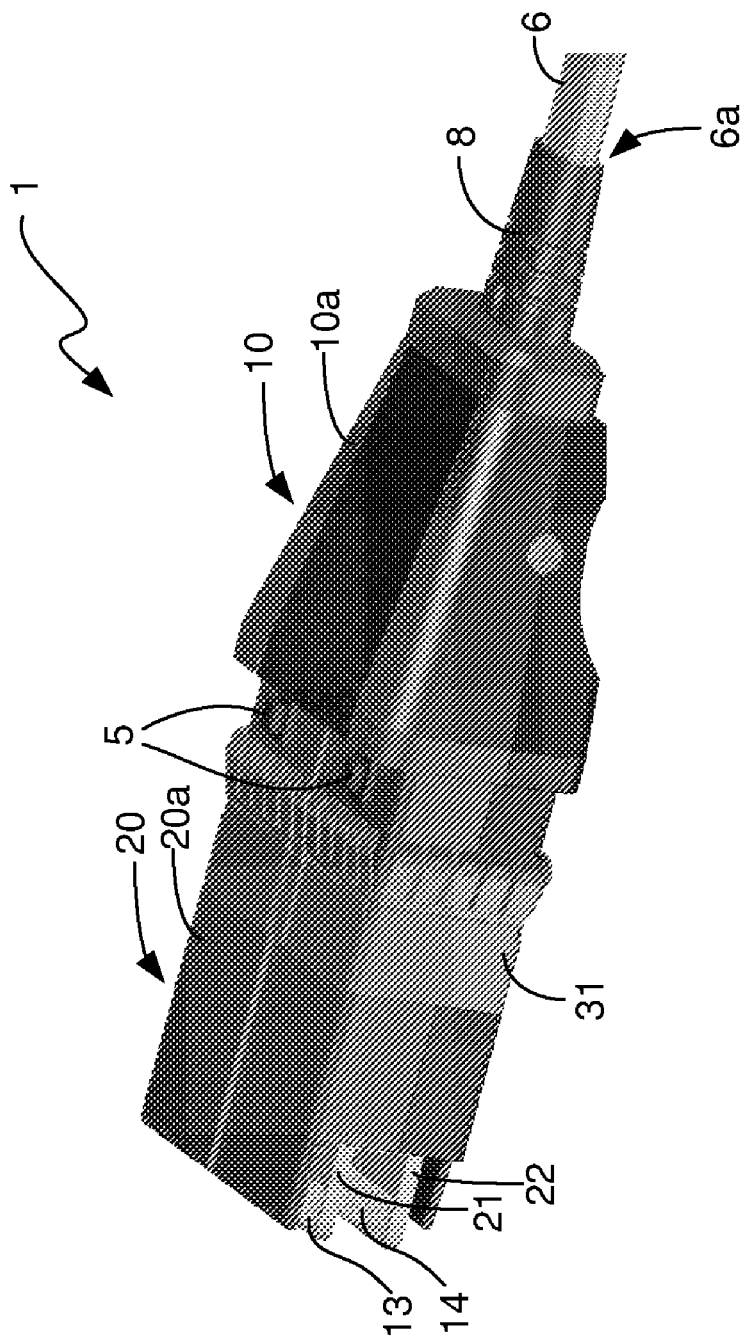
FIG. 1 illustrates a perspective side view of a parallel optical transceiver module that is equipped with an EMI cancelation device in accordance with the invention.

FIG. 1 illustrates a perspective view of a parallel optical transceiver module 1 that incorporates an EMI cancelation device (not shown), which will be described below in detail with reference to FIG. 2. In accordance with this illustrative embodiment, the parallel optical transceiver module 1 is part an active optical cable that includes first and second optical ribbon cable 6, an optical connector module 10 connected to a boot 8 that is secured to the end 6a of the cable 6, and a plug 20 mechanically coupled with the optical connector module 10. The optical connector module 10 and the plug 20 have housings 10a and 20a, respectively, which are typically made of metal, such as metal die cast material, for example.

The plug 20 of the optical transceiver module 1 is configured to be inserted into an opening formed in a cage (not shown). Locking pins 5 located on the plug housing 20a are received in respective latch openings formed in the cage when the plug 20 is fully inserted into the cage, thereby interlocking the plug 20 with the cage. In this interlocked position, first and second rows of electrical contacts 13 and 14 disposed on first and second circuit boards 21 and 22, respectively, are received in respective slots (not shown) of an electrical connector (not shown) located inside of the cage to make electrical connections between the optical transceiver module 1 and the electrical connector.

Figure 2:
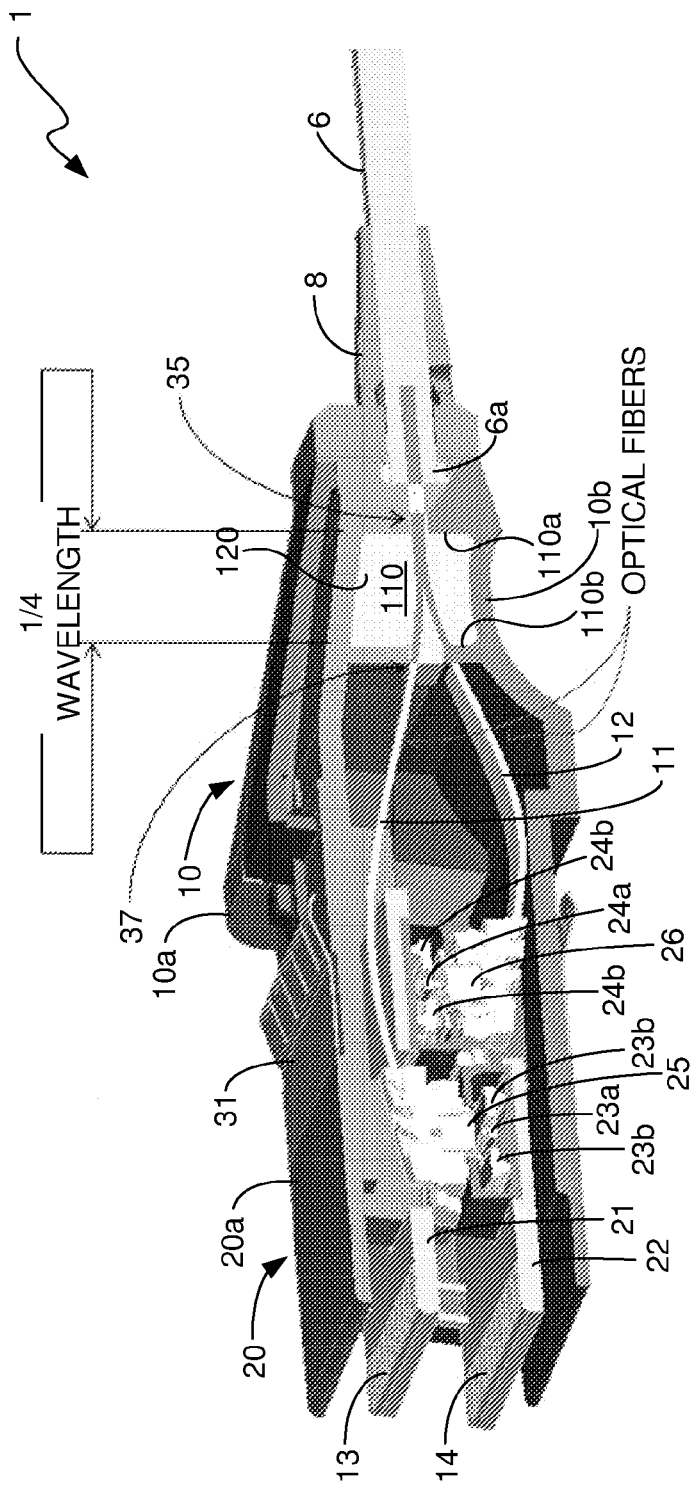
FIG. 2 illustrates a side cross-sectional view of the optical transceiver module shown in FIG. 1.

FIG. 2 illustrates a side cross-sectional view of the parallel optical transceiver module 1 shown in FIG. 1. The first and second circuit boards 21 and 22, respectively, of the plug 20 have TX components and RX components mounted thereon. The TX components include a plurality of laser diodes 23a and laser diode driver circuitry 23b. The RX components 24 include a plurality of photodiodes 24a and receiver circuitry 24b. A first optical coupling system 25 of the plug 20 is attached to ends (not shown) of transmit optical fibers 11 of the ribbon cable 6. A second optical coupling system 26 of the plug 20 is attached to ends (not shown) of receive optical fibers 12 of the ribbon cable 6. During operations, optical signals produced by the laser diodes 23a are coupled via the first optical coupling system 25 into the ends of the transmit optical fibers 11 and optical signals passing out of the ends of the receive optical fibers 12 are coupled via the second optical coupling system 26 onto the photodiodes 24a.

As shown in FIGS. 1 and 2, the optical transceiver module 1 includes an EMI collar 31 of the type described above for providing EMI shielding. The EMI collar 31 is secured about the periphery of the housing 20a of the plug 20 near where the locking pins 5 couple with latch openings formed in the cage (not shown). The EMI collar 31 is effective at preventing EMI from escaping through the latch openings. There are other areas, however, where EMI may escape from the optical transceiver module 1 if other EMI shielding is not employed. In particular, an opening 35 (FIG. 2) exists in the optical connector module 10 through which EMI may escape. The opening 35 is provided to allow the optical fibers 11 and 12 to pass through the optical connector module 10 into the plug 20. The ribbon cable 6 carries a 1×N array of the transmit optical fibers 11 and a 1×N array of the receive optical fibers 12, where N is the number of fibers in each of the arrays. Thus, the opening 35 is at least large enough to allow the 2×N array of optical fibers to pass through it.

Figure 3:
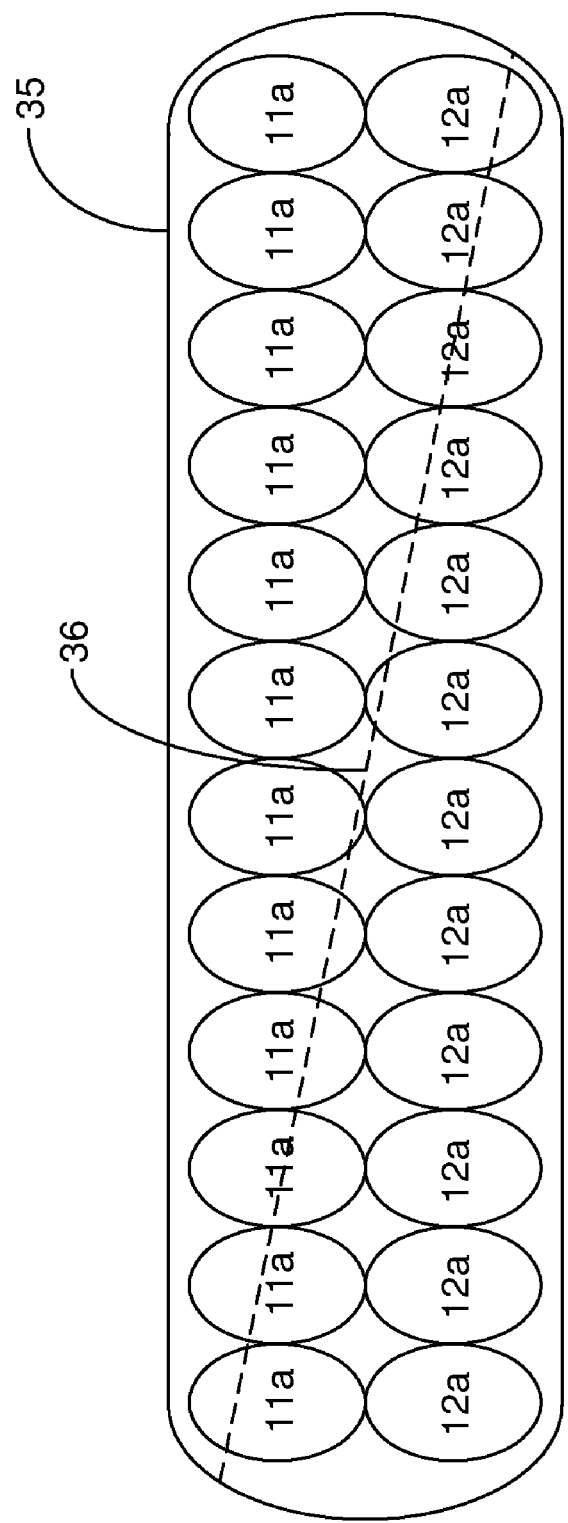
FIG. 3 illustrates a plan view of the ends of the optical fibers that pass through an opening in the optical transceiver module shown in FIGS. 1 and 2 that constitutes an EMI open aperture.

FIG. 3 illustrates a plan view of the ends 11a and 12a of the optical fibers 11 and 12, respectively, which pass through the opening 35. The opening 35 constitutes an EMI open aperture. The dashed line 36 in FIG. 3 represents the largest dimension of the EMI open aperture corresponding to the opening 35. For cases in which the primary frequency of the optical transceiver module 1 is relatively high (e.g., 5 gigahertz (GHz)=10 Gbps), the EMI open aperture dimension represented by the dashed line 36 is much larger than the maximum allowable EMI aperture dimension, which is about one wavelength at the primary frequency. Therefore, if a proper EMI shielding solution is not employed, an unacceptable amount of EMI will escape through the opening 35.

With reference again to FIG. 2, an EMI cancelation device is disposed in the nose 10b of the optical connector module 10. As indicated above, the housing 10a of the optical connector module 10 is made of metal. The EMI cancelation device comprises a metal chamber 110 having at least first and second walls 110a and 110b, respectively, that are spaced apart from each other by a distance that is equal to, or substantially equal to, one-quarter wavelength of the primary frequency of the optical transceiver module 1. The aforementioned opening 35 is formed in the first chamber wall 110a. A second opening 37 is formed in the second chamber wall 110b. The fibers 11 and 12 pass through the openings 35 and 37.

During operations, EMI of the primary frequency that is generated within the plug 20 propagates through the second opening 37 formed in the second chamber wall 110b and into the metal chamber 110. At least a portion of the EMI that enters the metal chamber 110 is incident on the first chamber wall 110a and reflected thereby back toward the second chamber wall 110b. Because the distance between the chamber walls 110a and 110b is one-quarter wavelength, the EMI reflected by the first chamber wall 11a at a first instant in time and the EMI entering the chamber 110 through the second opening 37 at a second instant in time that is later than the first instant in time destructively interfere. The destructive interference causes at least a significant portion of the EMI to be canceled and thus prevented from escaping through the opening 35.

The EMI cancelation device attenuates EMI by about 20 decibels (dB). The amount of EMI that is attenuated by the EMI cancelation device can be increased by disposing an EMI absorption material 120 in the chamber 110. The EMI absorption material 120 may be any material that absorbs EMI of the frequency or frequencies of interest. One type of material that is suitable for this purpose is ECCORS ORB® material, which is a material that is sold by Emerson & Cuming Microwave Products of Belgium. ECCOSORB® material is a polyurethane foam material impregnated with carbon black dispersions having controlled conductivity. The inclusion of the EMI absorption material 120 in the chamber 110 further attenuates EMI. The combination of the EMI cancelation effects of the chamber 110 and the EMI absorption effects of the EMI absorption material 120 result in an overall EMI attenuation of about 60 dB.

While the EMI cancelation device is designed to attenuate EMI of the frequency of interest, the EMI cancelation device also cancels and/or absorbs EMI at other frequencies. For example, EMI at frequencies that are harmonics of the frequency of interest will also experience destructive interference in the chamber 110. In addition, the EMI absorption material 120 typically is capable of absorbing EMI having a relatively broad range of frequencies. Therefore, the EMI cancelation device is effective at attenuating EMI over a range of frequencies including, but not limited to, the frequency of interest. Also, the distance between the first and second chamber walls 110a and 110b can be selected to be less than or greater than a quarter wavelength of the primary frequency (e.g., one eighth wavelength or one half wavelength) to detune the chamber 110 such that wavelengths other than, or in addition to, the primary wavelength are attenuated.

It should be noted that the invention has been described with respect to illustrative embodiments for the purpose of describing the principles and concepts of the invention. The invention is not limited to these embodiments. As will be understood by those skilled in the art in view of the description being provided herein, modifications may be made to the embodiments described herein without deviating from the scope of the invention. For example, while the invention has been described with reference to a particular type of optical transceiver module, the invention is not limited to being used with optical transceiver modules having any particular configuration. Also, the invention may be used in optical transmitter modules that do not have receiver functionality and in optical receiver modules that do not have transmitter functionality. The term "optical transceiver module", as that term is used herein, is intended to denote all such modules.

What is claimed is:

1. An optical transceiver module comprising:
   an optical transceiver module housing; and
   an electromagnetic interference (EMI) cancelation device disposed in the housing, the EMI cancelation device including a metal chamber having at least first and second walls that are generally parallel to each other, the first and second chamber walls having first and second openings formed therein, respectively, through which at least one optical fiber passes, the first and second chamber walls being separated from each other by a preselected distance, wherein the preselected distance is selected to ensure that EMI that passes through the second opening and is incident on the first wall at a first instant in time is reflected back toward the second wall and destructively interferes with EMI passing through the second opening at a second instant in time that is later than the first instant in time.

2. The optical transceiver module of claim 1, wherein the preselected distance is equal to, or approximately equal to, one quarter wavelength of the EMI.

3. The optical transceiver module of claim 2, further comprising:
   an EMI absorption material disposed in the metal chamber.

4. The optical transceiver module of claim 3, wherein the EMI absorption material comprises polyurethane foam.

5. The optical transceiver module of claim 3, wherein the EMI cancelation device is disposed in a nose of the optical transceiver module housing near a location on the module at which an end of an optical fiber cable comprising said at least one optical fiber is secured to the housing.

6. A method for attenuating electromagnetic interference (EMI) in an optical transceiver module, the method comprising:
providing an optical transceiver module having a housing in which a metal chamber is disposed, the metal chamber having first and second walls that are generally parallel to each other, the first and second walls having first and second openings formed therein, respectively, through which at least one optical fiber extends, wherein the first and second chamber walls are separated from each other by a preselected distance; and
at a first instant in time, reflecting EMI off of the first wall of the metal chamber toward the second opening formed in the second wall of the chamber such that EMI propagating through the second opening at a second instant in time that is later than the first instant in time destructively interferes with the EMI reflected off of the first wall.

7. The method of claim 6, wherein the preselected distance is equal to, or approximately equal to, one quarter wavelength of the EMI.

8. The method of claim 7, wherein the chamber has an EMI absorption material disposed therein.

9. The method of claim 8, wherein the EMI absorption material comprises polyurethane foam.

10. The method of claim 8, wherein the metal chamber is disposed in a nose of the optical transceiver module housing near a location on the module at which an end of an optical fiber cable comprising said at least one optical fiber is secured to the housing.

* * * * *